(12) United States Patent  
Furumiya et al.

(10) Patent No.: US 8,013,385 B2  
(45) Date of Patent: Sep. 6, 2011

(54) SEMICONDUCTOR DEVICE

(75) Inventors: Masayuki Furumiya, Kanagawa (JP); Yasutaka Nakashiba, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 95 days.

(21) Appl. No.: 12/632,342

(22) Filed: Dec. 7, 2009

(65) Prior Publication Data

US 2010/0140677 A1 Jun. 10, 2010

(30) Foreign Application Priority Data

Dec. 5, 2008 (JP) ................................. 2008-310361

(51) Int. Cl.
*H01L 21/02* (2006.01)

(52) U.S. Cl. ........ 257/328; 257/379; 257/554; 257/762; 257/E21.582; 257/E21.658; 257/E23.019; 257/E23.142; 257/E27.016; 257/E29.327

(58) Field of Classification Search .................. 257/328, 257/356, 379, 544, 752–762, 21.059, 311, 257/507, 575–582, 658, 23.019, 142, 27.016, 257/29.327

See application file for complete search history.

(56) References Cited

U.S. PATENT DOCUMENTS

| | | | | |
|---|---|---|---|---|
| 6,060,783 | A * | 5/2000 | Juengling et al. | 257/752 |
| 6,717,209 | B1 * | 4/2004 | Kim et al. | 257/328 |
| 6,902,959 | B2 * | 6/2005 | Kim et al. | 438/141 |
| 7,432,556 | B2 * | 10/2008 | Eriguchi et al. | 257/356 |
| 7,649,262 | B2 * | 1/2010 | Chapple-Sokol et al. | 257/762 |
| 7,674,683 | B2 * | 3/2010 | Beigel | 438/414 |
| 2004/0157442 | A1 * | 8/2004 | Cowley et al. | 438/687 |

FOREIGN PATENT DOCUMENTS

| | | |
|---|---|---|
| JP | 2001-085630 | 3/2001 |
| JP | 2004-241762 | 8/2004 |
| JP | 2006-261455 | 9/2006 |
| JP | 2008-124449 | 5/2008 |

* cited by examiner

*Primary Examiner* — Michael S Lebentritt  
(74) *Attorney, Agent, or Firm* — Young & Thompson

(57) ABSTRACT

A semiconductor device of the present invention has a first contact and a second contact which are located over a device isolation film so as to be opposed with each other, and have a length in the horizontal direction larger than the height; a first electro-conductive pattern located on the first contact and is formed in at least a single interconnect layer; a second electro-conductive pattern located on the second contact so as to be opposed with the first electro-conductive pattern; and an interconnect formed in an upper interconnect layer which is located above the first electro-conductive pattern and the second electro-conductive pattern, so as to be located in a region above the first electro-conductive pattern and the second electro-conductive pattern.

7 Claims, 5 Drawing Sheets

SEMICONDUCTOR DEVICE

This application is based on Japanese patent application No. 2008-310361, the content of which is incorporated hereinto by reference.

BACKGROUND

1. Technical Field

The present invention relates to a semiconductor device having a capacitor element.

2. Related Art

Capacitor elements having predetermined values of capacitance are adopted to semiconductor devices which contain analog circuits and digital circuits.

Japanese Laid-open patent publication NO. 2001-85630 describes a technique of forming a load capacitance or capacitor, making use of capacitance between interconnects in the same layer or between through-holes. The publication particularly describes that each of doubly-provided seal rings is used as each electrode of the capacitor.

Japanese Laid-open patent publication NO. 2006-261455 describes a capacitor making use of two comb-like electrodes formed in the same layer. Each electrode is formed over a plurality of interconnect layers and via layers, wherein the lowermost electro-conductive layer of each electrode is composed of a metal interconnect layer located above a transistor.

Japanese Laid-open patent publication NO. 2004-241762 describes a technique of forming a capacitor, using strip-like electrodes arranged in a plurality of interconnect layers. The plurality of strip-like electrodes are formed in the individual interconnect layers, according to a single design rule. Vertically overlapped electrodes are connected with each other through vias.

Japanese Laid-open patent publication NO. 2008-124449 describes a capacitor element formed in the same layer with contact plugs which are connected to transistors.

The patent inventors have recognized as follows. Shrinkage of the semiconductor devices requires shrinkage of areas occupied by the capacitor elements. Shrinkage of the area occupied by the capacitor element may preferably be achieved by allowing the electrodes, which compose the capacitor elements, to extend in the direction of stacking. However, layout of interconnects may be restricted, if the electrodes of the capacitor elements are formed over all of the interconnect layers.

SUMMARY

In one embodiment, there is provided a semiconductor device comprising:

a device isolation film formed in a substrate;

a first contact and a second contact located over the device isolation film so as to be opposed with each other, each of which including a length in the horizontal direction larger than the height;

a first electro-conductive pattern located on the first contact, and formed in at least a single interconnect layer;

a second electro-conductive pattern located on the second contact so as to be opposed with the first electro-conductive pattern, and formed in at least a single interconnect layer; and an upper interconnect layer located above the first electro-conductive pattern and the second electro-conductive pattern, wherein, the upper interconnect layer is provided so as to locate a portion of the upper interconnect layer composed of an insulating film or a portion of the upper interconnect layer composed of a third electro-conductive pattern, which is different from the first electro-conductive pattern and the second electro-conductive pattern, above the first electro-conductive pattern and the second electro-conductive pattern.

In thus-configured semiconductor device, the first contact and the first electro-conductive pattern function together as one electrode of a capacitor element, meanwhile the second contact and the second electro-conductive pattern function together as the other electrode of the capacitor element. The first contact and the second contact are located over the device isolation film. The first electro-conductive pattern and the second electro-conductive pattern are located on the first contact and the second contact, respectively, and are formed in at least a single interconnect layer. Accordingly, the electrodes which compose the capacitor element may be extended from the lowermost electro-conductive layer upwardly in the direction of stacking. In addition, the upper interconnect layer is provided so as to locate a portion thereof composed of an insulating film or a portion thereof composed of a third electro-conductive pattern, which is different from the first electro-conductive pattern and the second electro-conductive pattern, above the first electro-conductive pattern and the second electro-conductive pattern. In other words, since there are no electrodes of the capacitor element formed in the upper interconnect layer, so that restriction on the layout of interconnects may be minimized.

According to the present invention, the electrodes which compose the capacitor element may be extended in the direction of stacking, while suppressing any restriction on the layout of interconnects.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

Figure 1:
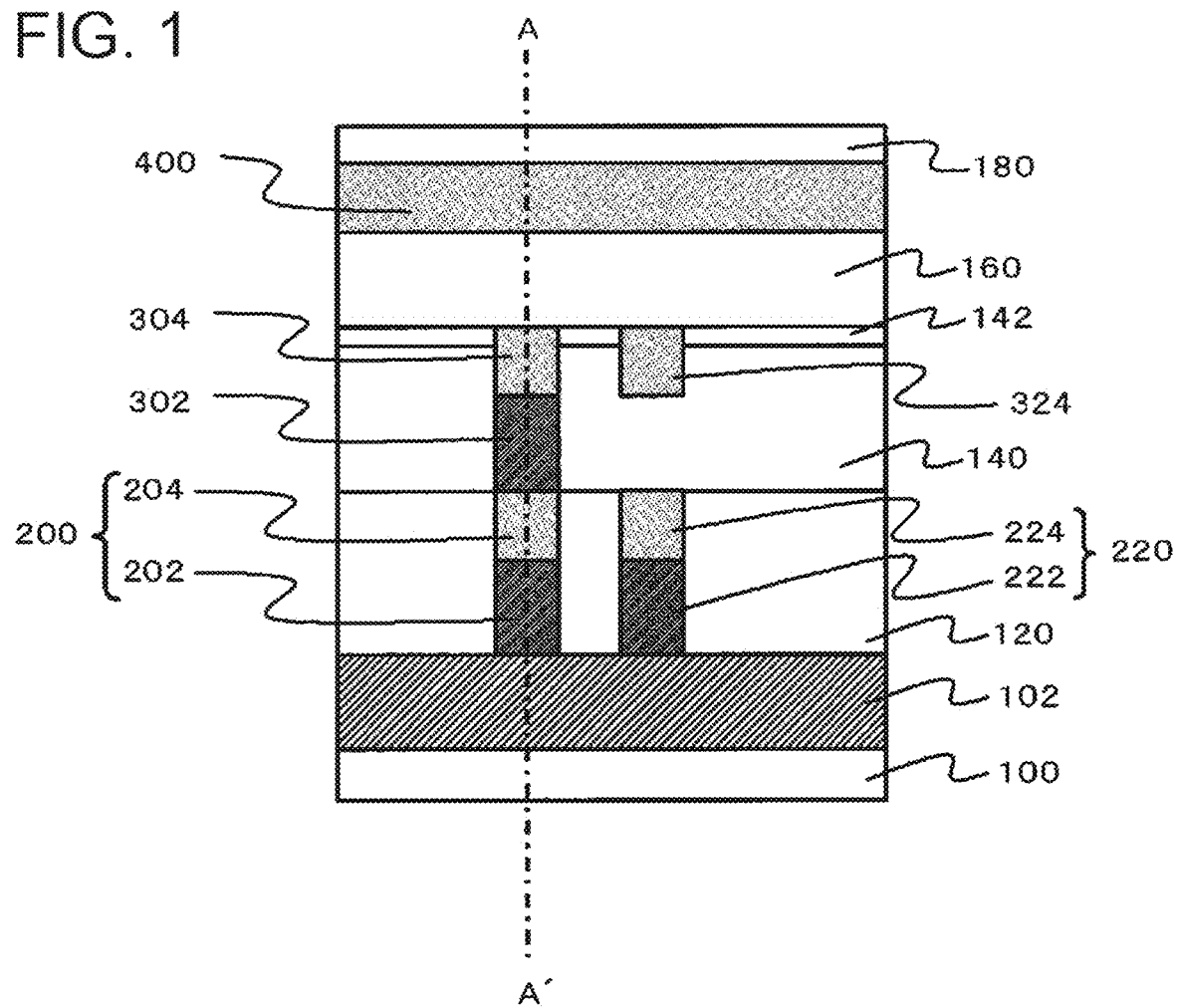
FIG. 1 is a sectional view illustrating a configuration of a semiconductor device of a first embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained below, referring to the attached drawings. Note that any similar constituents in all drawings will be given with similar reference numerals or symbols, and explanations therefor will not be repeated.

Figure 2:
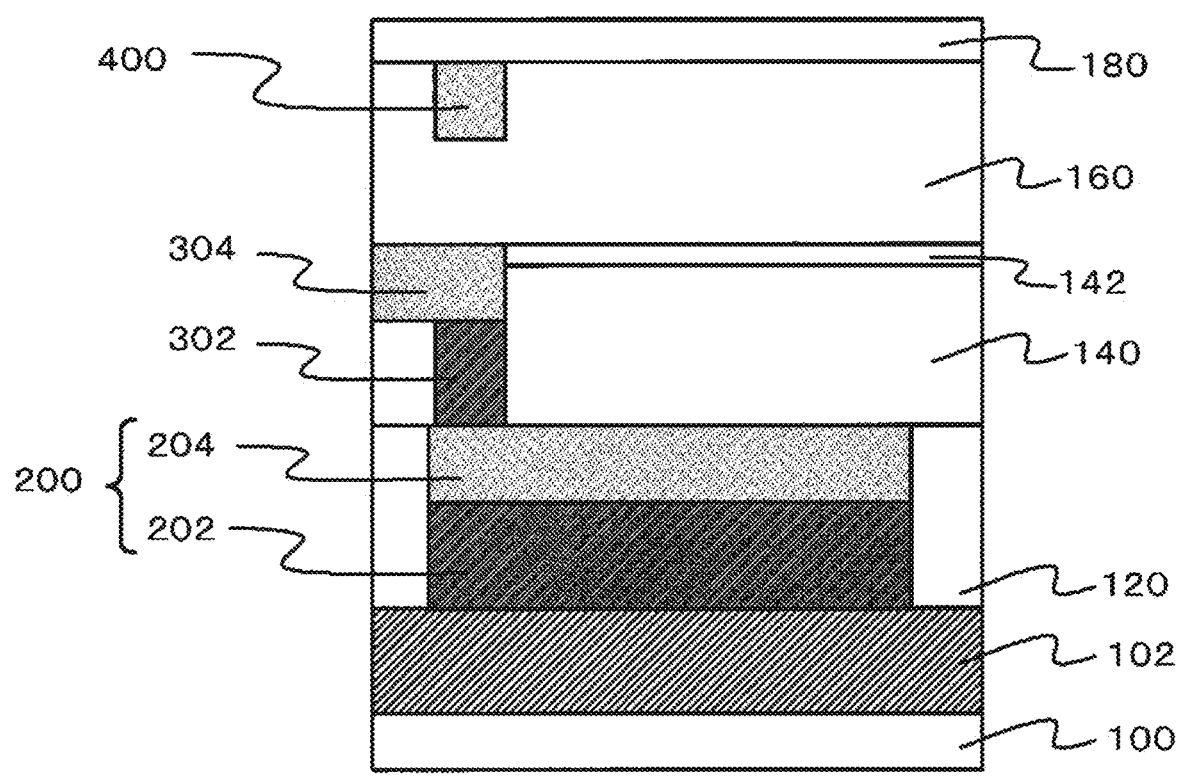
FIG. 2 is a sectional view of the semiconductor device taken along line A-A' in FIG. 1.

FIG. 1 is a sectional view illustrating a configuration of a semiconductor device of a first embodiment, and FIG. 2 is a sectional view of the semiconductor device taken along line A-A' in FIG. 1. The semiconductor device has a device isolation film 102 formed in a substrate 100 (silicon substrate, for example), a first contact 202 and a second contact 222, a first electro-conductive pattern 204 and a second electro-conductive pattern 224, and a third electro-conductive pattern (interconnect) 400. The first contact 202 and the second contact 222 are located over the device isolation film 102 so as to be opposed with each other, and each of which has a length in the horizontal direction larger than the height. The first electro-conductive pattern 204 is located on the first contact 202, and is formed in at least a single interconnect layer. The second electro-conductive pattern 224 is located on the second contact 222 so as to be opposed with the first electro-conductive pattern 204, and is formed in at least a single interconnect layer. The interconnect 400 is formed in an upper (uppermost, for example) interconnect layer located above the first electro-conductive pattern 204 and the second electro-conductive pattern 224, and is located in a region above the first electro-conductive pattern 204 and the second electro-conductive pattern 224.

In this embodiment, the lower end of the first contact 202 and the lower end of the second contact 222 are brought into contact with the device isolation film 102. As described in the above, each of the first contact 202 and the second contact 222 has a length in the horizontal direction larger than the height thereof, and extends in the horizontal direction. Planar geometry of the first contact 202 and the second contact 222 may be comb-like. The distance between the first contact 202 and the second contact 222 may be equal to or smaller than 140 nm, for example. The distance between the first contact 202 and the second contact 222 may be nearly equal to the width of the first contact 202. The distance between the first contact 202 and the second contact 222 is a minimum distance specified by a minimum design rule of this semiconductor device. The first contact 202 and the second contact 222 are typically composed of tungsten.

The first contact 202 and the second contact 222 are buried in an insulating film 120. Accordingly, there is the insulating film 120 between the first contact 202 and second contact 222. The insulating film 120 is typically composed of a silicon oxide film.

In the example illustrated in the drawing, the first electro-conductive pattern 204 and the second electro-conductive pattern 224 are composed of Cu patterns formed in a first interconnect layer, wherein the lower surfaces of which are brought into contact with the first contact 202 and the second contact 222, respectively. The first electro-conductive pattern 204 and the second electro-conductive pattern 224 have the same pattern geometry with the first contact 202 and the second contact 222, respectively. The insulating film 120 is located also between the first electro-conductive pattern 204 and the second electro-conductive pattern 224. One electrode 200 of a capacitor element is configured by the first contact 202 and the first electro-conductive pattern 204, and the other electrode 220 of the capacitor element is configured by the second contact 222 and the second electro-conductive pattern 224.

As illustrated in FIG. 2, the electrode 200 is connected through a via 302, which is located on the first electro-conductive pattern 204, to an interconnect 304. The interconnect 304 is located in an interconnect layer laid right above the first electro-conductive pattern 204. The via 302 and the interconnect 304 are buried in an insulating film 140 located above the first electro-conductive pattern 204. Although not illustrated, also the electrode 220 is connected through a via (not illustrated), which is located in the same layer with the via 302, to an interconnect 324 illustrated in FIG. 1.

The insulating film 140 has a dielectric constant smaller than that of the insulating film 120. For example, the insulating film 140 is configured by a low-k film having a dielectric constant of equal to or smaller than 3.3, and more preferably equal to or smaller than 2.9. The insulating film 140 may be configured by a film which typically contains Si, O and C. More specifically, the insulating film 140 may be configured by any film composed of SiOC (SiOCH), methyl silsesquioxane (MSQ), hydrogenated methyl silsesquioxane (MHSQ) or organic polysiloxane, or any of these films converted to have a porous structure. Over the insulating film 140, a protective insulating film 142 is formed. The protective insulating film 142 may typically be formed by a silicon oxide film.

Over the protective insulating film 142, an insulating film 160 and a topmost interconnect layer are located. The insulating film 160 is typically composed of a material similar to that composing the insulating film 140. In the example illustrated in the drawing, the topmost interconnect layer is provided so as to locate the portion thereof composed of the interconnect 400, in a region above the first electro-conductive pattern 204 and the second electro-conductive pattern 224. The regions, however, not always necessarily have an electro-conductive pattern such as the interconnect 400, and may have the insulating film 160 instead.

Over the topmost interconnect layer, a protective insulating film 180 is formed.

Next, operations and effects of the present invention will be explained. In the semiconductor device of this embodiment, the first contact 202 and the first electro-conductive pattern 204 function together as one electrode of a capacitor element, and the second contact 222 and the second electro-conductive pattern 224 function together as the other electrode of the capacitor element. The first contact 202 and the second contact 222 are located over the device isolation film 102, and the first electro-conductive pattern 204 and the second electro-conductive pattern 224 are located on the first contact 202 and the second contact 222, respectively. Accordingly, the electrodes which compose the capacitor element may be extended upwardly from the lowermost electro-conductive layer.

The upper (for example, topmost) interconnect layer is provided so as to locate a portion thereof composed of the interconnect 400, which has a geometry different from those of the first electro-conductive pattern and the second electro-conductive pattern, above the first electro-conductive pattern and the second electro-conductive pattern. In other words, since there are no electrodes of the capacitor element formed in the upper interconnect layer, so that restriction on the layout of interconnects may be reduced.

The first electro-conductive pattern 204 and the second electro-conductive pattern 224, exemplified in this embodiment so as to be formed by only a single interconnect layer, may alternatively be formed by a plurality of interconnect layers and via layer(s) located therebetween. The insulating film 140 located over the first electro-conductive pattern 204 and the second electro-conductive pattern 224 has a dielectric constant smaller than that of the insulating film 120 located between the electrode 200 and the electrode 220. Accordingly, the capacitance may increase only to a limited degree, if any electro-conductive pattern composing portions of the electrode 200 and the electrode 220 should otherwise be formed in the same layer with the via 302 and the interconnect 304. This configuration may, however, largely restrict the layout of interconnects, and may decrease the capacitance of the capacitor element. Taking these factors into consideration, it may be apparent that formation of the electrode 200 and the electrode 220 in the layer lower than the layer to which so-called low-k film is adopted, just like in this embodiment, may contribute to improve the balance among capacitance of the capacitor element, breakdown voltage, and degree of freedom of layout of the interconnects. Note that the breakdown voltage of the capacitor element may be improved also because the electrodes of the capacitor element are located above the device isolation film 102, rather than above the substrate 100.

The capacitance of the capacitor element may be improved still also by adjusting the distance between the first contact 202 and the second contact 222 to equal to or smaller than 140 nm. In particular, the capacitance of the capacitor element may be increased, if the distance between the first contact 202 and the second contact 222 equals to a minimum distance specified by a minimum design rule of the semiconductor device.

Figure 3:
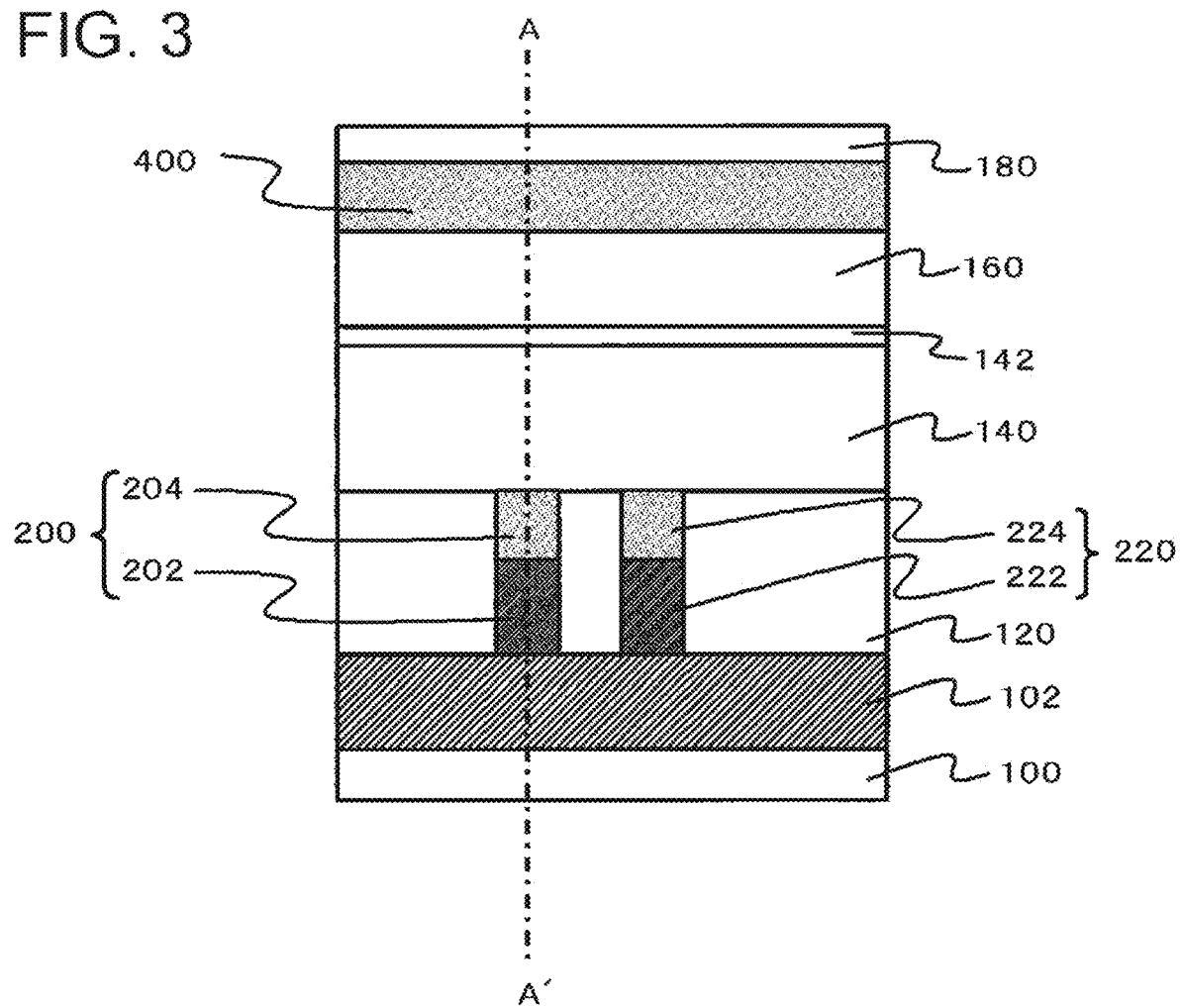
FIG. 3 is a sectional view illustrating a configuration of a semiconductor device of a second embodiment.
Figure 4:
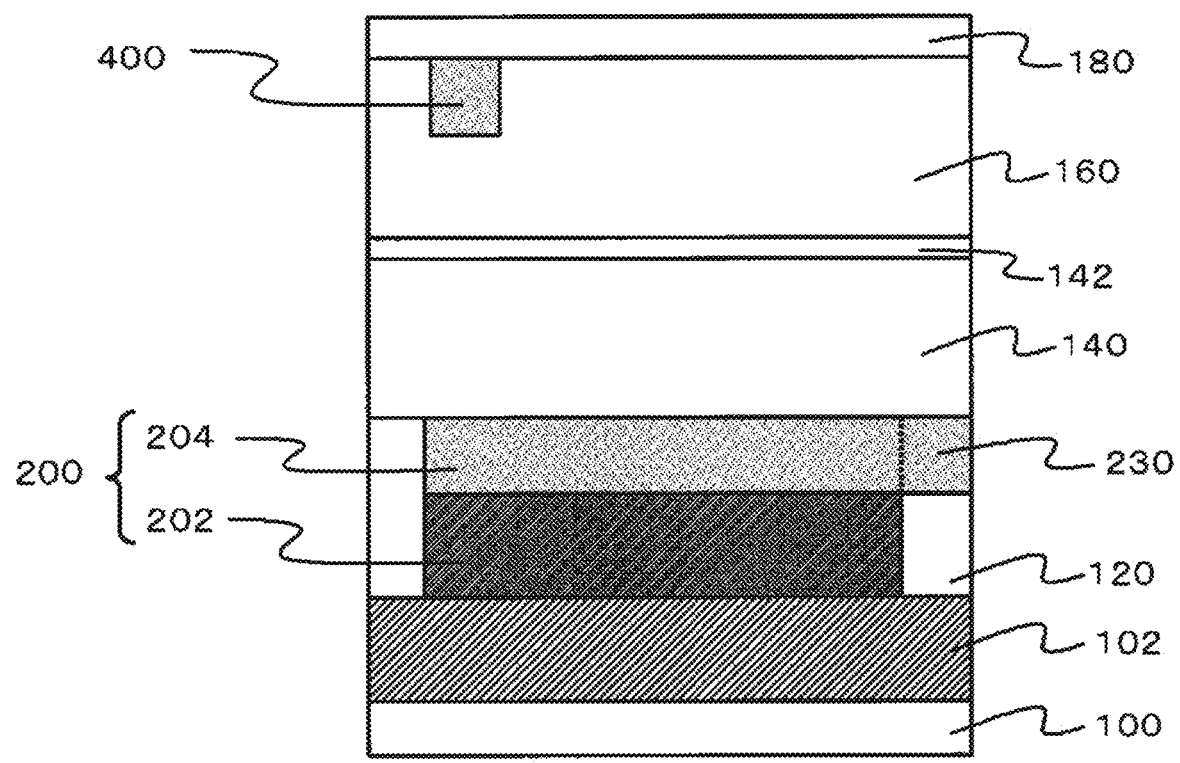
FIG. 4 is a sectional view of the semiconductor device taken along line A-A' in FIG. 3.

FIG. 3 and FIG. 4 are sectional views illustrating a configuration of a semiconductor device of a second embodiment, respectively corresponded to FIG. 1 and FIG. 2 in the first embodiment. The semiconductor device of this embodiment is configured similarly to as described in the first embodiment, except that the interconnects 302, 324 and the via connected thereto are not formed, that electrode 200 of the capacitor element is connected to an interconnect 230 which is in the same layer with the first electro-conductive pattern 204, and that the electrode 220 is connected to an interconnect (not illustrated) which is in the same layer with the second electro-conductive pattern 224.

Effects similar to those in the first embodiment may be obtained also in this embodiment.

Figure 5:
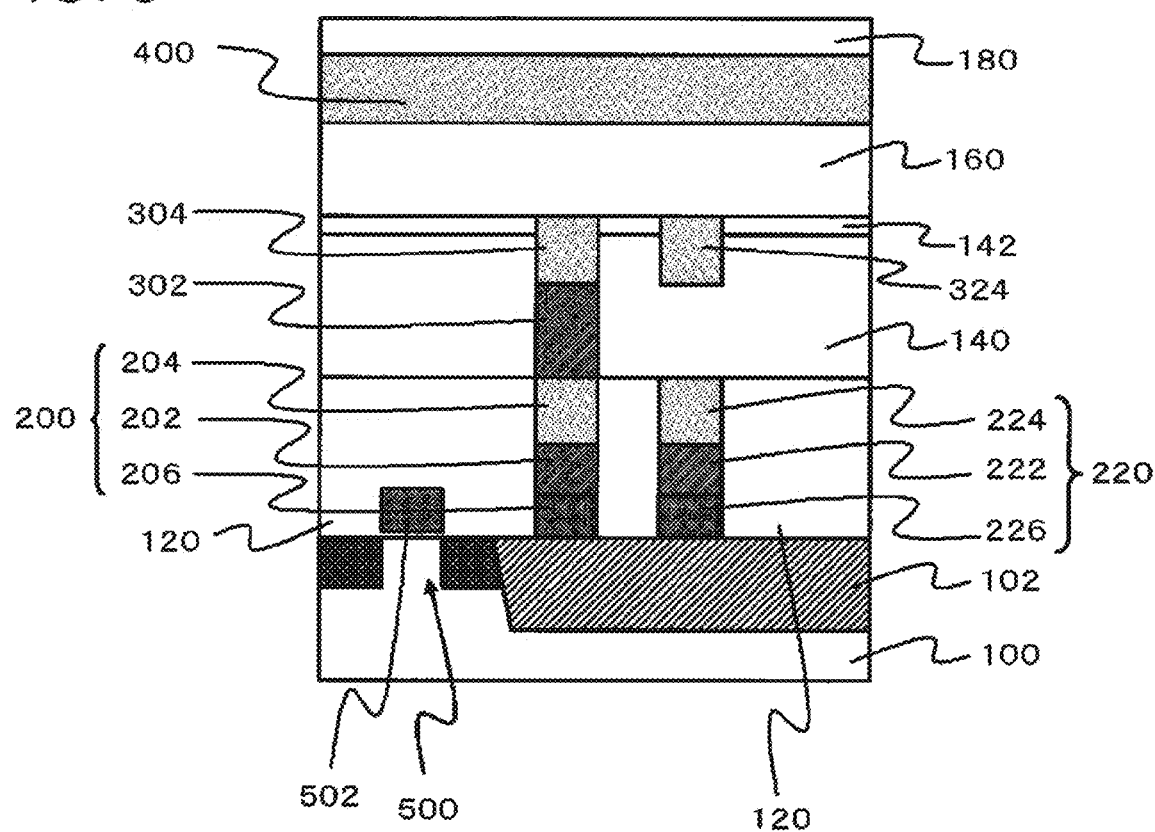
FIG. 5 is a sectional view illustrating a configuration of a semiconductor device of a third embodiment.

FIG. 5 is a sectional view illustrating a configuration of a semiconductor device of a third embodiment, corresponded to FIG. 1 explained in the first embodiment. The semiconductor device is configured similarly to the semiconductor device of the first embodiment, except that the electrode 200 has a first lower electro-conductive pattern 206, that the electrode 220 has a second lower electro-conductive pattern 226, and that a transistor 500 is provided.

The first lower electro-conductive pattern 206 has the upper surface brought into contact with the first contact 202, has the lower surface brought into contact with the device isolation film 102, and has a length in the horizontal direction larger than the height. The second lower electro-conductive pattern 226 has the upper surface brought into contact with the second contact 222, and has the lower surface brought into contact with the device isolation film 102. The second lower electro-conductive pattern 226 is opposed with the first lower electro-conductive pattern 206, and has a length in the horizontal direction larger than the height. The first lower electro-conductive pattern 206 has the same planar geometry with the first contact 202, and the second lower electro-conductive pattern 226 has the same planar geometry with the second contact 222.

The first lower electro-conductive pattern 206 and the second lower electro-conductive pattern 226 are formed in the same process with a gate electrode 502 of the transistor 500, and therefore have the same layer structure with the gate electrode 502. For an exemplary case where the gate electrode 502 is a polysilicon electrode, also the first lower electro-conductive pattern 206 and the second lower electro-conductive pattern 226 are composed of a polysilicon pattern, meanwhile for an exemplary case where the gate electrode 502 is a metal electrode, also the first lower electro-conductive pattern 206 and the second lower electro-conductive pattern 226 are composed of a metal pattern.

The semiconductor device of this embodiment may be manufactured by the processes below. First, the device isolation film 102 is formed in the substrate 100, and the transistor 500 is then formed. When the gate electrode 502 of the transistor 500 is formed, also the first lower electro-conductive pattern 206 and the second lower electro-conductive pattern 226 are formed.

Next, the insulating film 120 is formed over the transistor 500 and the device isolation film 102, and a trench pattern which is located on the first lower electro-conductive pattern 206, and a trench pattern which is located on the second lower electro-conductive pattern 226 are formed in the insulating film 120. In the process of forming these trench patterns, the first lower electro-conductive pattern 206 and the second lower electro-conductive pattern 226 function as an etching stopper.

Next, the trench pattern which is located on the first lower electro-conductive pattern 206 is filled with the first contact 202 and the first electro-conductive pattern 204, and the trench pattern which is located on the second lower electro-conductive pattern 226 is filled with the second contact 222 and the second electro-conductive pattern 224.

Thereafter, the insulating film 140, the protective insulating film 142, the via 302, the interconnects 304, 324, the insulating film 160, the interconnect 400, and the protective insulating film 180 are formed in this order.

Effects similar to those in the first embodiment may be obtained also in this embodiment. Since the first lower electro-conductive pattern 206 and the second lower electro-conductive pattern 226 are provided, these patterns may function as an etching stopper when the trench pattern to be filled with the first contact 202 and the first electro-conductive pattern 204, and the trench pattern to be filled with the second contact 222 and the second electro-conductive pattern 224 are formed in the insulating film 120. Accordingly, these trench patterns may be prevented from being excessively deepened into the device isolation film 102, so that the area of the electrodes of the capacitor element may be suppressed from departing from a designed value, and thereby the capacitance of the capacitor element may be suppressed from departing from a designed value.

Since the first lower electro-conductive pattern 206 and the second lower electro-conductive pattern 226 may be formed in the same process with the gate electrode 502 of the transistor 500, so that the number of processes in the manufacturing of the semiconductor device may be prevented from increasing.

In this embodiment, the distance between the first lower electro-conductive pattern 206 and the second lower electro-conductive pattern 226 may be adjusted narrower than the distance between the first electro-conductive pattern 204 and the second electro-conductive pattern 224, and the distance between the first contact 202 and the second contact 222. According to this configuration, the capacitance of the capacitor element may be increased, since the capacitance ascribable to the first lower electro-conductive pattern 206 and the second lower electro-conductive pattern 226 increases.

The embodiments of the present invention have been described in the above referring to the attached drawings, merely as examples of the present invention, without being precluded from adoption of any other various configurations.

It is apparent that the present invention is not limited to the above embodiments, but may be modified and changed without departing from the scope and spirit of the invention.

What is claimed is:

1. A semiconductor device comprising:
a device isolation film formed in a substrate;
a first contact and a second contact located over said device isolation film so as to be opposed with each other, each of which including a length in the horizontal direction larger than the height;
a first electro-conductive pattern located on said first contact, and formed in at least a single interconnect layer;
a second electro-conductive pattern located on said second contact so as to be opposed with said first electro-conductive pattern, and formed in at least a single interconnect layer; and
an upper interconnect layer located above said first electro-conductive pattern and said second electro-conductive pattern,
wherein, said upper interconnect layer is provided so as to locate a portion of said upper interconnect layer composed of an insulating film or a portion of said upper interconnect layer composed of a third electro-conductive pattern, which is different from said first electro-conductive pattern and said second electro-conductive pattern, above said first electro-conductive pattern and said second electro-conductive pattern.

2. The semiconductor device as claimed in claim 1,
wherein the lower end of said first contact and the lower end of said second contact are brought into contact with device isolation film.

3. The semiconductor device as claimed in claim 1, further comprising:
a first lower electro-conductive pattern including the top surface of said first lower electro-conductive pattern brought into contact with said first contact, and the lower surface of said first lower electro-conductive pattern brought into contact with said device isolation film, and including a length in the horizontal direction larger than the height; and
a second lower electro-conductive pattern including the top surface of said second lower electro-conductive pattern brought into contact with said second contact, and the lower surface of said second lower electro-conductive pattern brought into contact with said device isolation film, being provided so as to be opposed with said first lower electro-conductive pattern, and including the length in the horizontal direction larger than the height.

4. The semiconductor device as claimed in claim 3, further comprising:
a transistor which is formed in said substrate and has a gate electrode,
wherein said first lower electro-conductive pattern and said second lower electro-conductive pattern include the same layer structure with said gate electrode.

5. The semiconductor device as claimed in claim 1, further comprising:
a first insulating film located between a combination of said first contact and said first electro-conductive pattern and a combination of said second contact and said second electro-conductive pattern; and
a second insulating film located above said first electro-conductive pattern and said second electro-conductive pattern,
wherein said second insulating film includes a dielectric constant smaller than that of said first insulating film.

6. The semiconductor device as claimed in claim 1,
wherein the distance between said first contact and said second contact is equal to or smaller than 140 nm.

7. The semiconductor device as claimed in claim 6,
wherein the distance between said first contact and said second contact is a minimum distance specified by a minimum design rule for said semiconductor device.

* * * * *